US 8,692,282 B2

(12) United States Patent
Kim et al.

(10) Patent No.: US 8,692,282 B2
(45) Date of Patent: Apr. 8, 2014

(54) LIGHT EMITTING DIODE PACKAGE AND LIGHT EMITTING MODULE COMPRISING THE SAME

(75) Inventors: Byoung Sung Kim, Ansan-si (KR); Sang Eun Lim, Ansan-si (KR); Jae Jin Lee, Ansan-si (KR); Yeoun Chul Son, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 13/340,867

(22) Filed: Dec. 30, 2011

(65) Prior Publication Data

US 2013/0105851 A1    May 2, 2013

(30) Foreign Application Priority Data

Oct. 27, 2011  (KR) ................ 10-2011-0110651

(51) Int. Cl.
*H01L 33/00* (2010.01)
(52) U.S. Cl.
USPC .......................................................... 257/99
(58) Field of Classification Search
CPC ............. H01L 33/62; H01L 33/486; H01L 2224/48091; H01L 44/48; H01L 33/36; H01L 33/387
USPC .............................................. 257/98, 99, 100
See application file for complete search history.

(56) References Cited

U.S. PATENT DOCUMENTS

| 6,376,902 | B1 | 4/2002 | Arndt |
| 7,271,425 | B2 | 9/2007 | Arndt et al. |
| 7,626,250 | B2 | 12/2009 | Lee et al. |
| 2004/0126913 | A1 | 7/2004 | Loh |
| 2006/0103012 | A1 | 5/2006 | Chin |
| 2007/0252246 | A1 | 11/2007 | Ng et al. |
| 2010/0155748 | A1 | 6/2010 | Chan et al. |
| 2010/0155771 | A1* | 6/2010 | Bando ............................ 257/99 |
| 2011/0031865 | A1* | 2/2011 | Hussell et al. ................. 313/46 |
| 2011/0127569 | A1 | 6/2011 | Mineshita |
| 2011/0316022 | A1* | 12/2011 | Hussell .......................... 257/98 |

FOREIGN PATENT DOCUMENTS

| EP | 2284914 | 2/2011 |
| KR | 10-2010-0063877 | 6/2010 |
| KR | 10-2010-0093950 | 8/2010 |

OTHER PUBLICATIONS

International Search Report of PCT/KR2012/008726 was mailed Feb. 21, 2013.
Written Opinion of PCT/KR2012/008726 was mailed Feb. 21, 2013.
Non-Final Office Action dated Sep. 9, 2013 for U.S. Appl. No. 13/567,776.
Non-Final Office Action dated Jan. 10, 2014 in U.S. Appl. No. 13/567,776.

* cited by examiner

*Primary Examiner* — Nikolay Yushin
(74) *Attorney, Agent, or Firm* — H.C. Park & Associates, PLC

(57) ABSTRACT

Exemplary embodiments of the present invention provide a light emitting diode package including a light emitting diode chip, a lead frame having a chip area on which the light emitting diode chip is arranged, and a package body supporting the lead frame. The lead frame includes a first terminal group arranged at a first side of the chip area and a second terminal group arranged at a second side of the chip area. The first terminal group and the second terminal group each include a first terminal and a second terminal, and in at least one of the first terminal group and the second terminal group, the first terminal is connected to the chip area and the second terminal is separated from the chip area. The first terminal has a first width, the second terminal has a second width, and the first width is different than the second width.

16 Claims, 9 Drawing Sheets

LIGHT EMITTING DIODE PACKAGE AND LIGHT EMITTING MODULE COMPRISING THE SAME

CROSS-REFERENCE TO RELATED APPLICATION

This application claims priority from and the benefit of Korean Patent Application No. 10-2011-0110651, filed on Oct. 27, 2011, which is hereby incorporated by reference for all purposes as if fully set forth herein.

BACKGROUND OF THE INVENTION

1. Field of the Invention

Exemplary embodiments of the present invention relate to a light emitting diode package and a light emitting module including the same.

2. Discussion of the Background

Generally, a light emitting diode package may include a light emitting diode chip, a lead frame, and a package body. The lead frame may include a plurality of terminals having different polarities. The package body may support the lead frame. The terminals may extend from the interior of the package body to the outside of the package body. The light emitting diode chip may be electrically connected to the terminals inside the package body. The package body may be formed of a plastic resin or ceramic material. The package body made of plastic resin may have a cavity, which receives the light emitting diode chip while optically exposing the light emitting diode chip therethrough. Or, the package body may be at least partially transparent to allow light generated by the light emitting diode chip to be emitted to the outside therethrough.

A light emitting diode package having a plurality of terminals exposed to the outside of a package body may have some terminals exposed through one side of the package body and the other terminals exposed through the other side thereof. The terminals disposed at the one side of the package body and the terminals disposed at the other side of the package body may be connected to each other in a crossing region within the package body, on which the light emitting diode chip is mounted.

In one example of a conventional light emitting diode package, a separate terminal may be placed between two terminals disposed at one side of the package body, and another separate terminal may be placed between two terminals disposed at the other side of the package body.

In such a conventional light emitting diode package, the terminals disposed at the one side of the package body have the same size and shape as those of the terminals disposed at the other side of the package body. However, if the terminals of different polarities have the same size and shape, the terminals may have a restricted width and may be arranged at restricted intervals within the restricted area of the package body, thereby causing failure upon electrical testing of the light emitting diode package.

SUMMARY OF THE INVENTION

Exemplary embodiments of the present invention provide a light emitting diode package that includes terminals having suitable widths to improve reliability of electrical testing and/or reliability of bonding to a printed circuit board.

Additional features of the invention will be set forth in the description which follows, and in part will be apparent from the description, or may be learned by practice of the invention.

An exemplary embodiment of the present invention discloses a light emitting diode package, which includes a light emitting diode chip, a lead frame having a chip area on which the light emitting diode chip is arranged, and a package body supporting the lead frame. The lead frame includes a first terminal group arranged at a first side of the chip area and a second terminal group arranged at a second side of the chip area. The first terminal group and the second terminal group each include a first terminal and a second terminal, and in at least one of the first terminal group and the second terminal group, the first terminal is connected to the chip area and the second terminal is separated from the chip area. The first terminal has a first width, the second terminal has a second width, and the first width is different than the second width.

An exemplary embodiment of the present invention also discloses a light emitting diode package, which includes a light emitting diode chip, a lead frame having a chip area on which the light emitting diode chip is arranged, and a package body supporting the lead frame. The lead frame includes a first terminal group arranged at a first side of the chip area and a second terminal group arranged at a second side of the chip area. The first terminal group includes a first terminal and a second terminal connected to the first side of the chip area, and a fifth terminal separated from the chip area and arranged between the first terminal and the second terminal. The second terminal group includes a third terminal and a fourth terminal connected to the second side of the chip area, and a sixth terminal separated from the chip area and arranged between the third terminal and the fourth terminal. The fifth terminal comprises a first width, and the first terminal and second terminal comprise a second width, and the first width is greater than the second width.

An exemplary embodiment of the present invention also discloses a light emitting module including a printed circuit board and a light emitting diode package arranged on the printed circuit board. The light emitting diode package includes a light emitting diode chip, a lead frame having a chip area on which the light emitting diode chip is arranged, and a package body supporting the lead frame. The lead frame includes a first terminal group arranged at a first side of the chip area and a second terminal group arranged at a second side of the chip area. The printed circuit board includes a plurality of lands to which the terminals are bonded, each land having a width corresponding to the width of the terminal bonded thereto.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
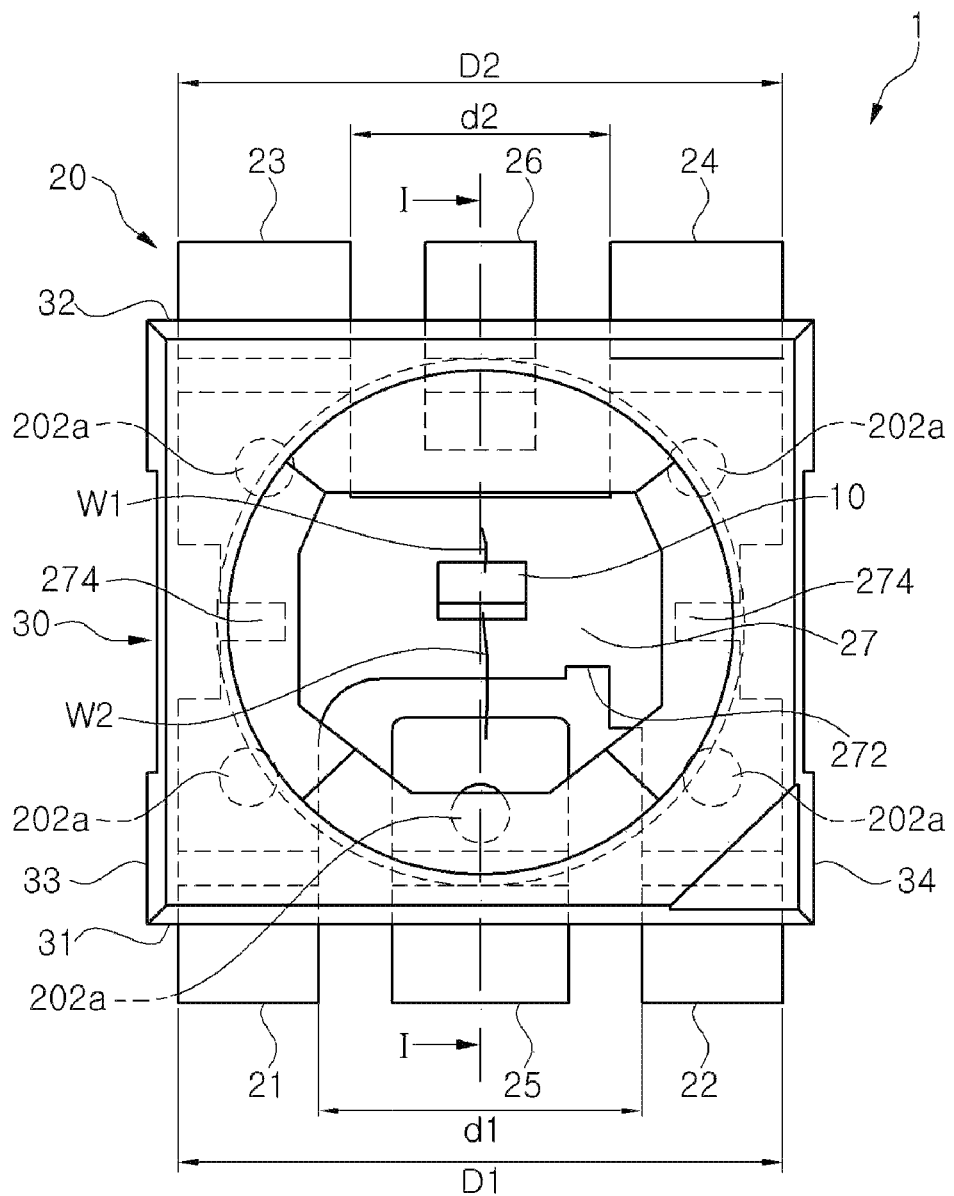
FIG. 1 is a plan view of a light emitting diode package in accordance with an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
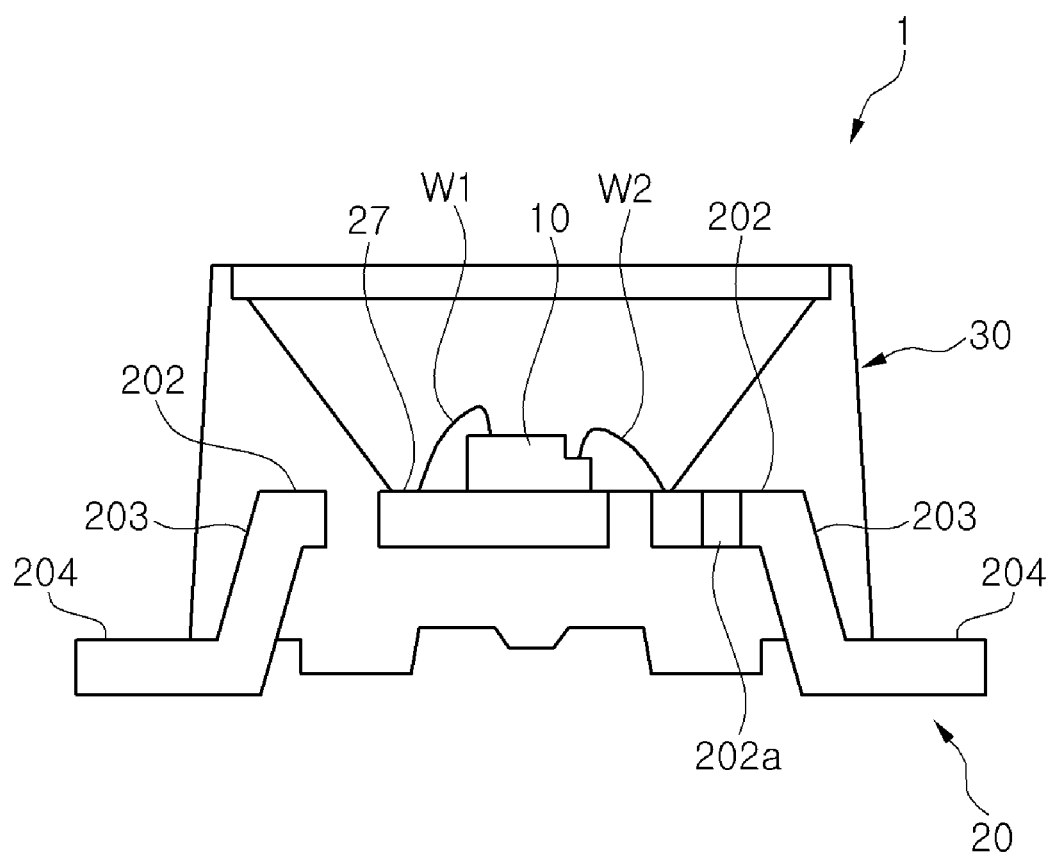
FIG. 2 is a cross-sectional view taken along line I-I of FIG. 1.
Figure 3:
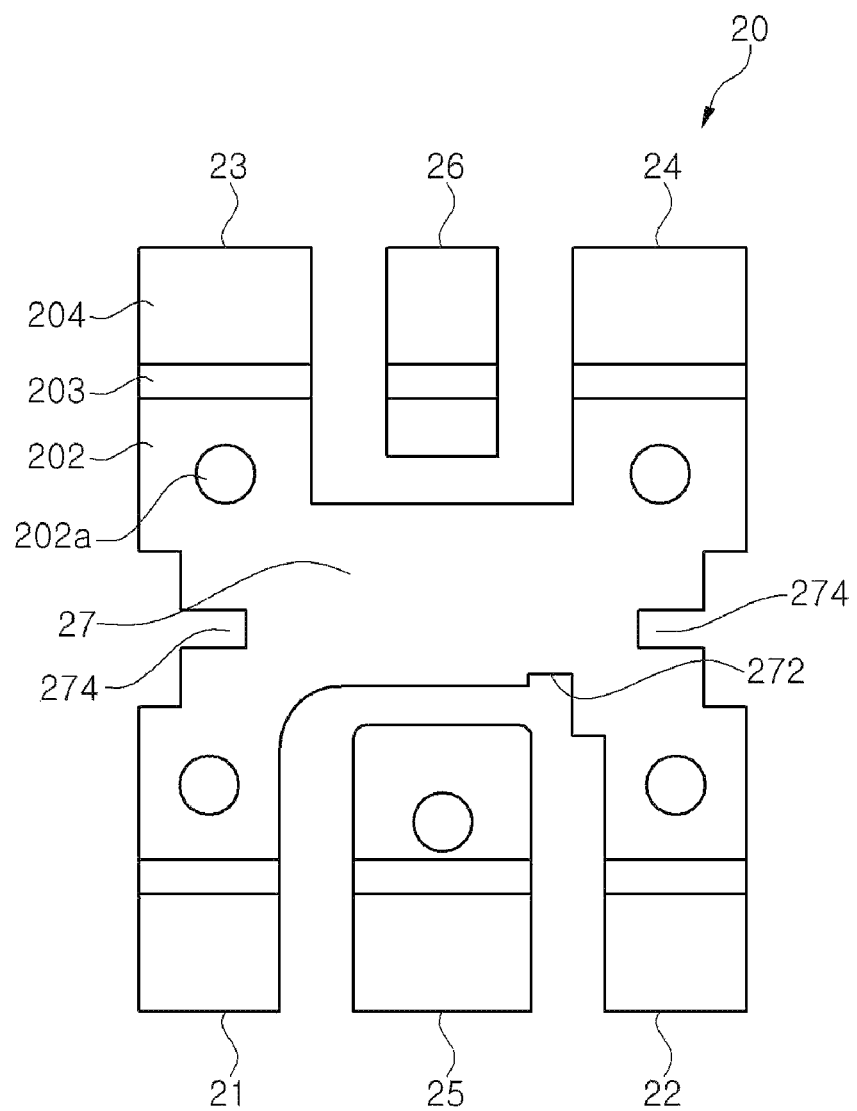
FIG. 3 is a plan view of a lead frame of the light emitting diode package shown in FIG. 1 and FIG. 2.

FIG. 1, FIG. 2, and FIG. 3 are views of a light emitting diode package according to an exemplary embodiment of the present invention.

Referring to FIG. 1, FIG. 2, and FIG. 3, the light emitting diode package 1 according to the present exemplary embodiment includes a light emitting diode chip 10, a lead frame 20, and a package body 30.

The package body 30 supports the lead frame 20. The package body 30 may be formed of a plastic resin by injection molding. An upper surface of the package body 30 may include a cavity. Part of the lead frame 20 and the light emitting diode chip 10 mounted on one region of the lead frame 20 are exposed through the cavity. The cavity may be formed with a light-transmitting encapsulating member (not shown). The encapsulating member may include a phosphor. The package body 30 has opposite side surfaces, that is, a first side surface 31 and a second side surface 32. Further, the package body 30 has a third side surface 33 and a fourth side surface 34 orthogonal to the first side surface 31 and the second side surface 32, respectively.

The lead frame 20 has a chip area 27 on which the light emitting diode chip 10 is mounted. Further, the lead frame 20 includes first, second, third, fourth, fifth, and sixth terminals 21, 22, 23, 24, 25, 26.

The first terminal 21 and the second terminal 22 extend outwards from one side of the chip area 27, and the third terminal 23 and the fourth terminal 24 extend outward from the other side of the chip area 27. The first terminal 21 is arranged parallel to the second terminal 22, and the third terminal 23 is arranged parallel to the fourth terminal 24. The first and second terminals 21, 22 are disposed to face the third and fourth terminals 23, 24, respectively. The first and second terminals 21, 22 extend beyond the first side surface 31 of the package body 30, and the third and fourth terminals 23, 24 extend beyond the second side surface 32 of the package body 30.

The fifth terminal 25 is arranged between the first terminal 21 and the second terminal 22, and the sixth terminal 26 is arranged between the third terminal 23 and the fourth terminal 24. The fifth terminal 25 and the sixth terminal 26 are separated from the chip area 27 on which the light emitting diode chip 10 is mounted. The fifth terminal 25 and the sixth terminal 26 are separated from other terminals, that is, the first, second, third and fourth terminals 21, 22, 23, 24.

As shown in FIG. 1, one electrode of the light emitting diode chip 10 mounted on the chip area 27 is connected to a first wire W1, which is bonded to the chip area 27. Thus, the first, second, third, and fourth terminals 21, 22, 23, 24 integrally connected to the chip area 27 have an identical polarity and are electrically connected to the one electrode of the light emitting diode chip 10. Further, the other electrode of the light emitting diode chip 10 is connected to a second wire W2, which is bonded to the fifth terminal 25. Thus, the fifth terminal 25 has a different polarity than that of the first, second, third, and fourth terminals 21, 22, 23, 24 and is electrically connected to the other electrode of the light emitting diode chip 10. The sixth terminal 26 is a dummy terminal, which is not electrically connected to the light emitting diode chip 10, and aids in reliable and stable bonding of the light emitting diode package 1 to the printed circuit board. The fifth terminal 25 has a greater width than the sixth terminal 26 to guarantee reliable bonding of the second wire W2. The sixth terminal 26 is not used for wire bonding.

When the light emitting diode chip 10 includes an electrode, for example, at a lower side thereof, electrical connection of the light emitting diode chip 10 can be achieved by mounting the light emitting diode chip 10 on the chip area 27, thereby enabling elimination of the first wire W1 as described above.

The width of the first terminal 21 and the width of the second terminal 22 are smaller than the width of the third terminal 23 and the width of the fourth terminal 24. This provides a sufficient distance between an inner surface of the first terminal 21 and an inner surface of the second terminal 22, thereby preventing a short circuit between the fifth terminal 25, the first terminal 21, and/or the second terminal 22 due to the wider fifth terminal 25. In the present exemplary embodiment, since a distance d1 between the inner surface of the first terminal 21 and the inner surface of the second terminal 22 is greater than a distance d2 between the inner surface of the third terminal 23 and the inner surface of the fourth terminal 24, a possibility of short circuit is reduced, and since a distance D1 between an outer surface of the first terminal 21 and an outer surface of the second terminal 22 is equal to a distance D2 between an outer surface of the third terminal 23 and an outer surface of the fourth terminal 24, the light emitting diode package 1 may be stably mounted on the printed circuit board.

As shown in FIG. 2, each of the terminals of the lead frame 20 include a flat upper section 202 coplanar with the chip area 27, a flat lower section 204 exposed through a lower surface of the package body 30, and a slanted connecting section 203, which connects the flat upper section 202 and the flat lower section 204 within the package body 30. In the present exemplary embodiment, each of the terminals 21, 22, 23, 24, 25, 26 (see FIG. 1) are bent within the package body 30 and exposed through the lower surface of the package body 30. This structure may be obtained by encapsulating a bent section of each terminal in plastic resin when the package body 30 is formed of the plastic resin by molding.

Referring again to FIG. 1, FIG. 2, and FIG. 3, the lead frame 20 includes connection holes 202a through which upper and lower portions of the package body 30 (with respect to the lead frame 20) are connected to each other. The connection holes 202a may be formed in the upper flat sections 202 of the first, second, third, fourth, and fifth terminals 21, 22, 23, 24, 25. Although the sixth terminal 26 is not shown with a connection hole, it may include a connection hole. Further, the lead frame 20 includes connection grooves 274 at edges thereof, particularly, at opposite edges of the chip area 27. The connection grooves 274 connect the upper and lower portions of the package body 30, along with the aforementioned connection holes 202a, thereby allowing the lead frame 20 to be more firmly supported by the package body 30.

The lead frame 20 includes a cut-out section 272 for alignment of the light emitting diode chip 10. The cut-out section 272 is formed at an edge of the chip area 27 exposed through the cavity during manufacture of the light emitting diode package 1. As the cut-out section 272 is sensed by an optical device or a sensor capable of detecting the cut-out section 272, it is possible to achieve mounting of the light emitting diode chip 10 at an accurate position of the chip area 27 through detection thereof. The likelihood of an error detecting a mounting position of the light emitting diode chip 10 may increase with increasing distance between the cut-out section 272 or a mark corresponding thereto and chip area 27.

Figure 4:
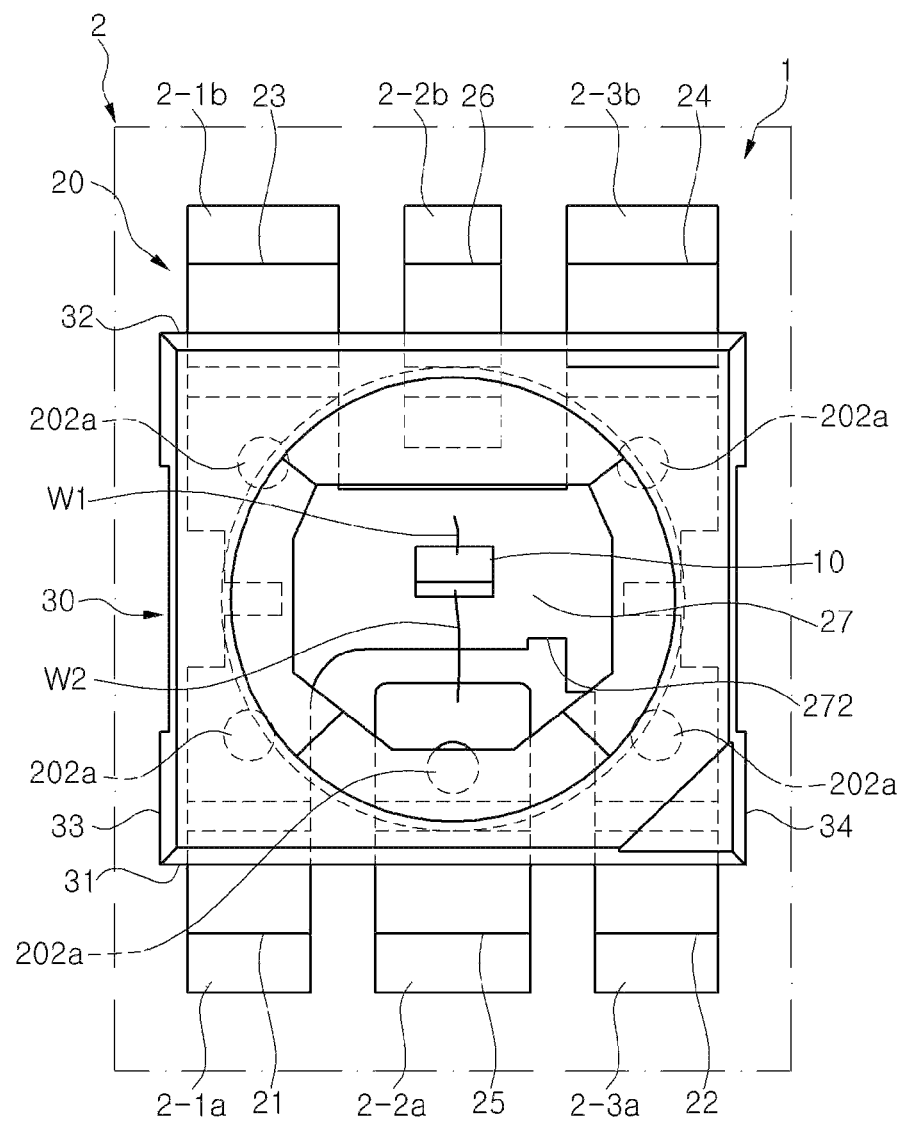
FIG. 4 is a plan view of a light emitting module including the light emitting diode package of FIG. 1, FIG. 2, and FIG. 3 on a printed circuit board.
Figure 5A:
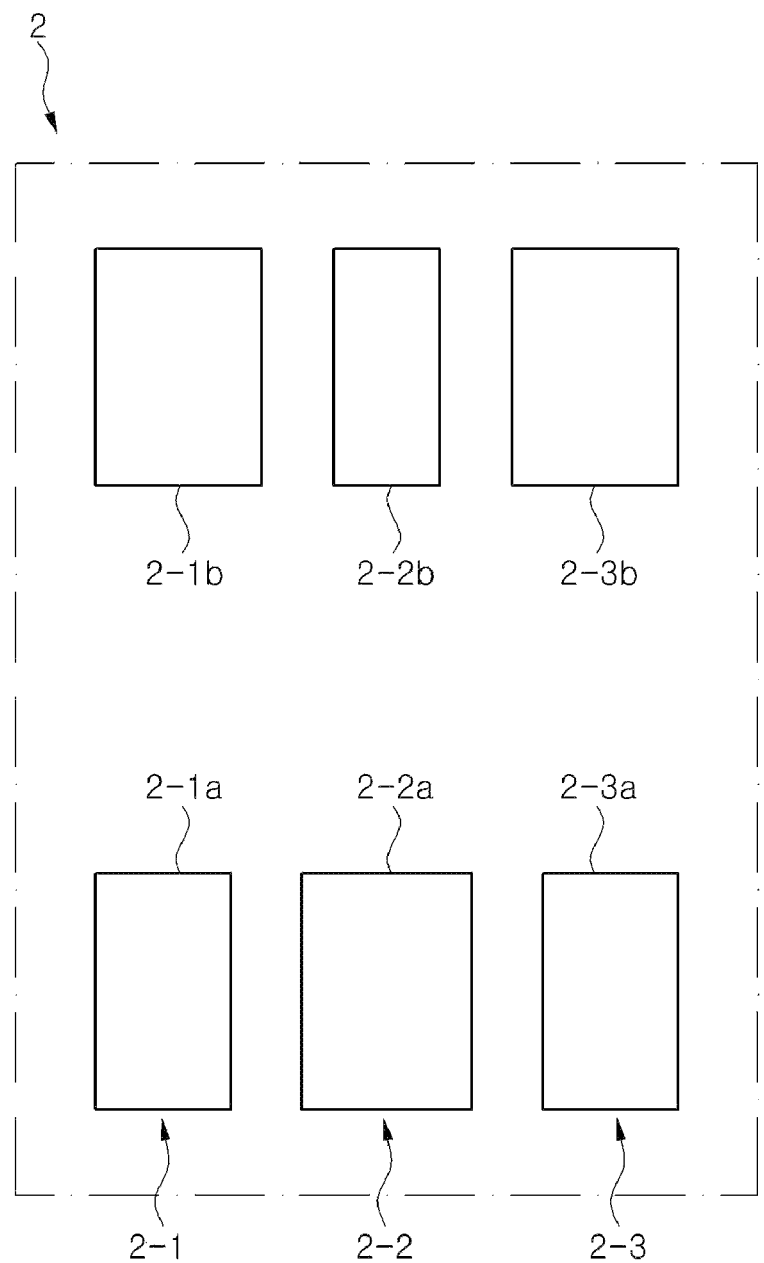
FIG. 5A, FIG. 5B, and FIG. 5C are views illustrating examples of a land pattern suited to the printed circuit board shown in FIG. 4.
Figure 5B:
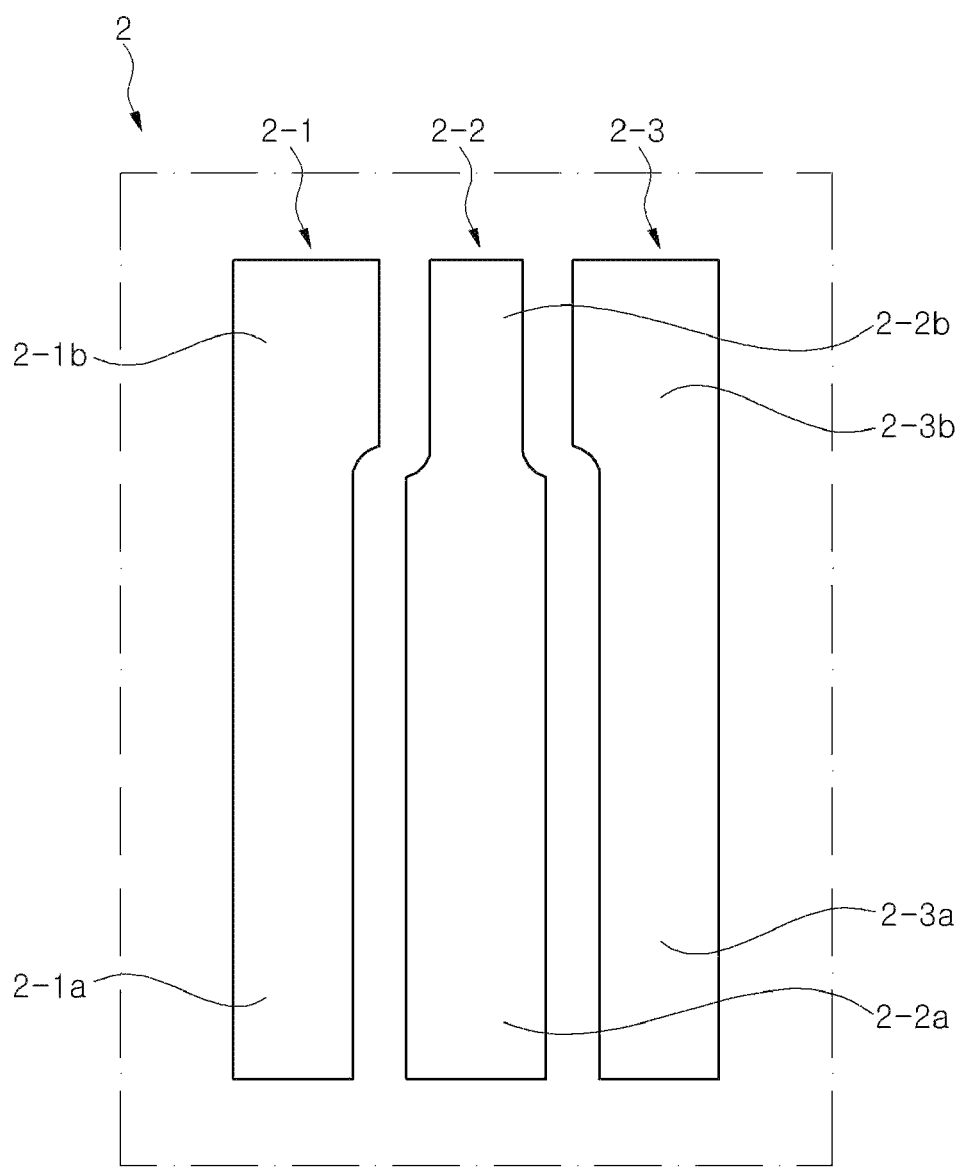
Figure 6A:
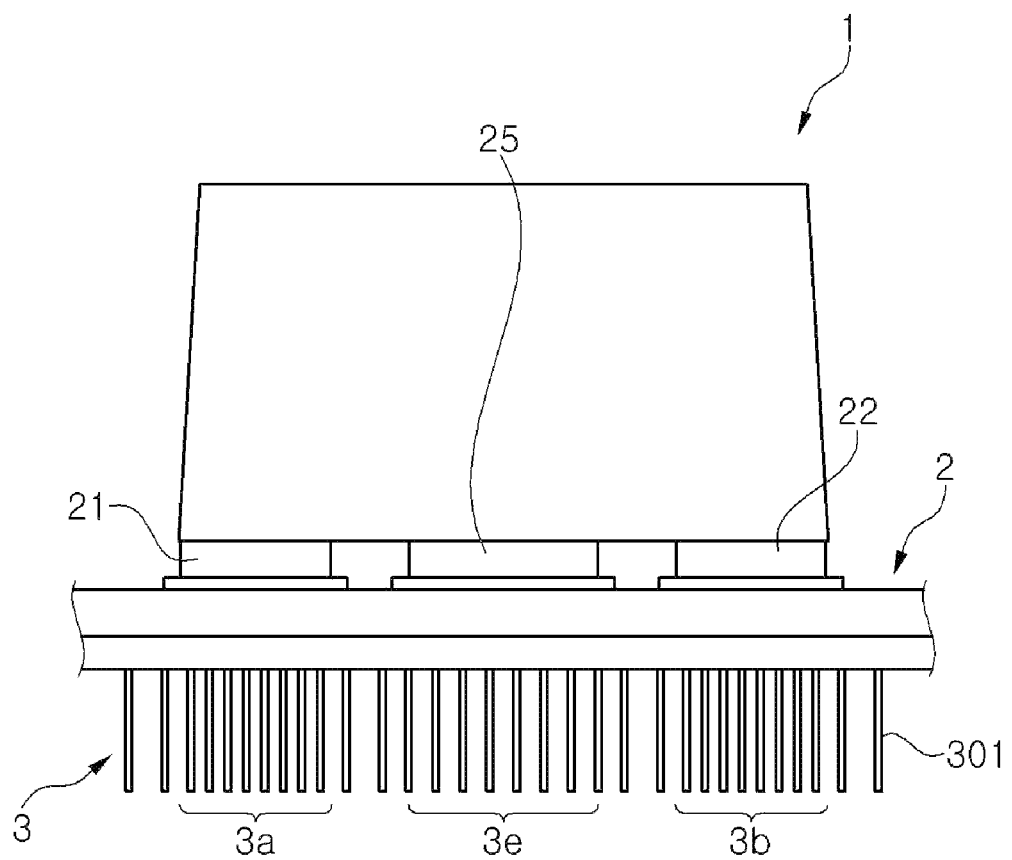
FIG. 6A and FIG. 6B are side views of the light emitting module shown in FIG. 4, showing opposite sides of the light emitting module.
Figure 6B:
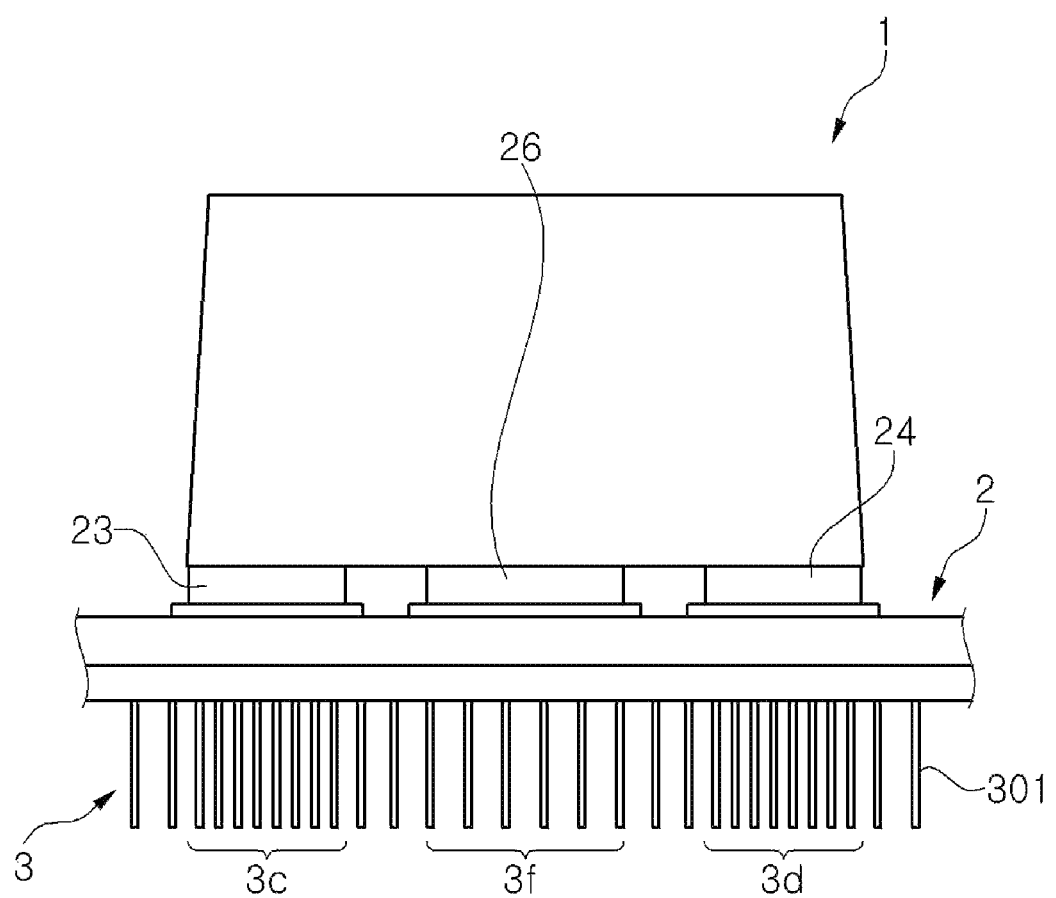

FIG. 4 is a plan view of a light emitting module including the light emitting diode package of FIG. 1, FIG. 2, and FIG. 3 on a printed circuit board, FIG. 5A and FIG. 5B are views illustrating examples of a land pattern suited to the printed circuit board shown in FIG. 4; and FIG. 6A and FIG. 6B are side views of the light emitting module shown in FIG. 4, showing opposite sides of the light emitting module.

In FIG. 4, the light emitting module includes a printed circuit board 2 on which the light emitting diode package 1 is mounted.

The printed circuit board 2 includes a first land pattern 2-1, a second land pattern 2-2 and a third land pattern 2-3 formed on an upper surface thereof, on which the light emitting diode package 1 is mounted. The first land pattern 2-1, the second land pattern 2-2, and the third land pattern 2-3 are arranged parallel to each other. The second land pattern 2-2 is arranged between the first land pattern 2-1 and the third land pattern 2-3.

In the present exemplary embodiment, two opposite terminals of the light emitting diode package 1, that is, the first terminal 21 and the third terminal 23, are bonded to the first land pattern 2-1, and two other opposite terminals of the light emitting diode package 1, that is, the second terminal 22 and the fourth terminal 24, are bonded to the third land pattern 2-3. The first land pattern 2-1 and the third land pattern 2-3 have an identical polarity, and the first, second, third, and fourth terminals 21, 22, 23, 24 have an identical polarity and are electrically connected to the first and third land patterns 2-1, 2-3.

The fifth and sixth terminals 25, 26 arranged at the middle of the light emitting diode package 1 and separated from the first, second, third, and fourth terminals 21, 22, 23, 24, are bonded to the second land pattern 2-2. As described above, the fifth terminal 25 and the sixth terminal 26 are separated from each other, and the sixth terminal 26 is a dummy terminal, which is not electrically connected to the light emitting diode chip 10. The second land pattern 2-2 has a different polarity than that of the first and third land patterns 2-1, 2-3 and is electrically connected to the fifth terminal 25. Here, the second land pattern 2-2 has a front section 2-2a, which is wider than a rear section 2-2b of the second land pattern 2-2, thereby allowing reliable bonding of the fifth terminal 25, which is wider than the sixth terminal 206.

Further, the first land pattern 2-1 has a front section 2-1a to which the first terminal 21 is bonded and which has a smaller width than a rear section 2-1b of the first land pattern 2-1 to which the third terminal 23 is bonded. The third land pattern 2-3 also has a front section 2-3a to which the second terminal 22 is bonded and which has a smaller width than a rear section 2-3b of the third land pattern 2-3 to which the fourth terminal 24 is bonded.

The second land pattern 2-2 may be a separated pattern having a front section 2-2a and a rear section 2-2b that are separated from each other, as shown in FIG. 5A. Alternatively, the second land pattern 2-2 may be an integral pattern having the front section 2-2a and the rear section 2-2b connected to each other, as shown in FIG. 5B. Since the rear section 2-2b of the second land pattern 2-2 is bonded to the sixth terminal 26, that is, the dummy terminal, a short circuit does not occur when the front section 2-2a is connected to or disconnected from the rear section 2-2b.

The first land pattern 2-1 may be a separated pattern having the front section 2-1a and the rear section 2-1b separated from each other, as shown in FIG. 5a. Alternatively, the first land pattern 2-1 may be an integral pattern having the front section 2-1a and the rear section 2-1b connected to each other, as shown in FIG. 5B. Since the first and third terminals 21, 23 bonded to the front and rear sections 2-1a, 2-1b of the first land pattern 2-1 have an identical polarity, a short circuit does not occur when the front section 2-1a is connected to or disconnected from the rear section 2-1b.

The third land pattern 2-3 may be a separated pattern having the front section 2-3a and the rear section 2-3b separated from each other, as shown in FIG. 5a. Alternatively, the third land pattern 2-3 may be an integral pattern having the front section 2-3a and the rear section 2-3b connected to each other, as shown in FIG. 5B. Since the second and fourth terminals 22, 24 bonded to the front and rear sections 2-3a, 2-3b of the third land pattern 2-3 have an identical polarity, a short circuit does not occur when the front section 2-3a is connected to or disconnected from the rear section 2-3b.

Figure 5C:
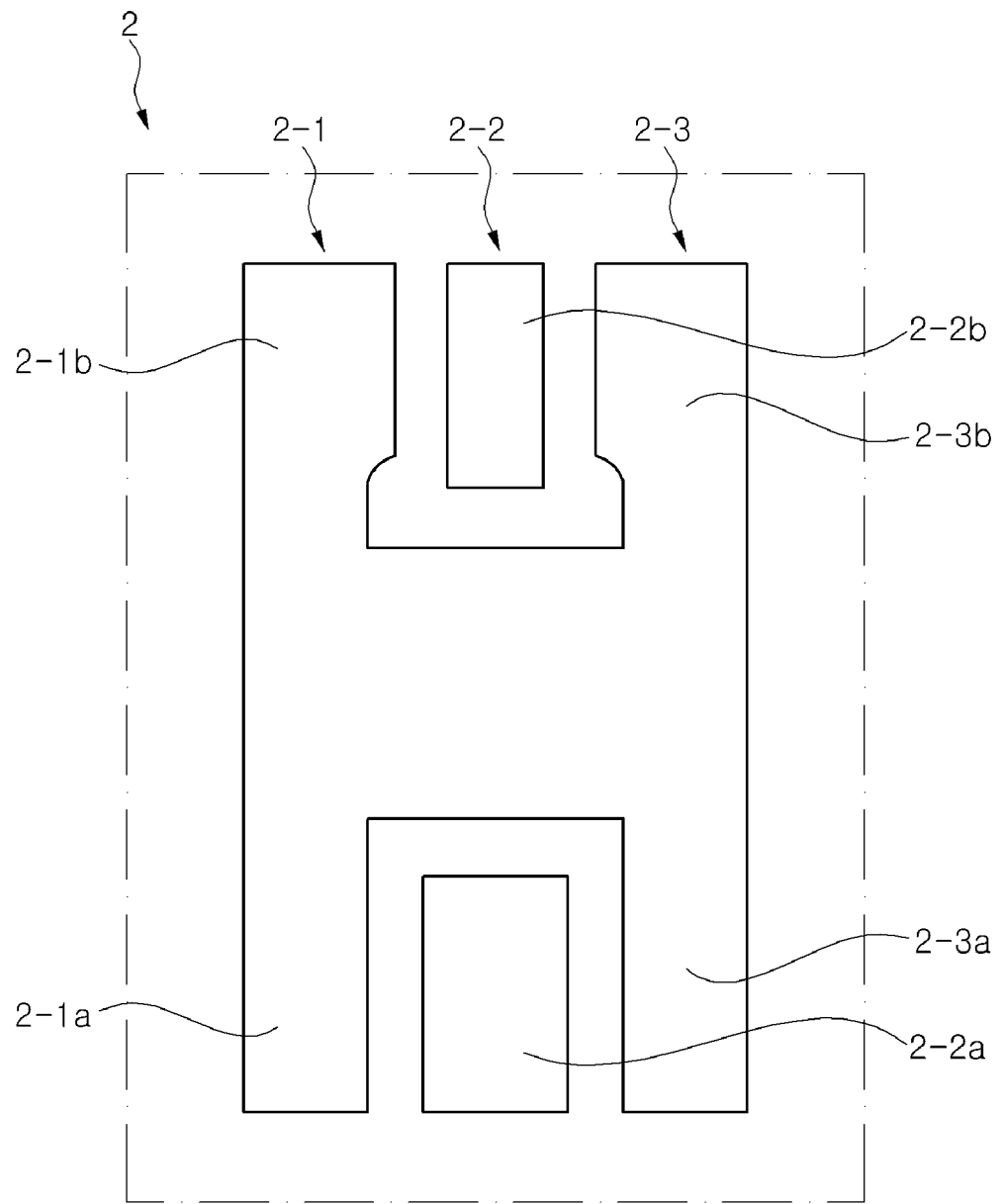

In the present exemplary embodiment, the chip area 27 of the lead frame 20 is not exposed through the lower surface of the package body 30. However, the height of the chip area 27 of the lead frame 20 may be lowered so as to expose the chip area 27 of the lead frame 20 through the lower surface of the package body 30. As shown in FIG. 5C, a central land pattern may be further formed to connect the first land pattern 2-1 and the second land pattern 2-3 through a gap between the front section 2-2a and the rear section 2-2b of the second land pattern 2-2 (the front section 2-2a and the rear section 2-2b are separated from each other). Thus, the central land pattern may contact the chip area 27 of the lead frame 20, or may be bonded thereto.

As shown in FIG. 6A and FIG. 6B, the light emitting module may include a heat sink 3 attached to the lower surface of the printed circuit board 2 on which the light emitting diode package 1 is mounted. The heat sink 3 includes a plurality of heat dissipation fins 301 on a lower surface thereof. Here, the heat sink 30 includes zones having different densities of heat dissipation fins 301. The density of heat dissipation fins 301 for each terminal may be set depending on the heat generation rate of the corresponding terminal upon operation of the light emitting diode chip 10.

First, referring to FIG. 6A, first and second zones 3a, 3b of the heat sink 3 disposed directly under the first and second terminals 21, 22 have a higher density of heat dissipation fins 301 than a fifth zone 3e of the heat sink 3 disposed directly under the fifth terminal 25. Since the first and second terminals 21, 22 are integrally connected to the chip area of the lead frame 20 connected to the light emitting diode package 1, the first and second zones 3a, 3b of the heat sink 3 disposed directly under the first and second terminals 21, 22 may increase in density of heat dissipation fins 301 by decreasing the distance between the heat dissipation fins 301.

Next, referring to FIG. 6B, third and fourth zones 3c, 3d of the heat sink 3 disposed directly under the third and fourth terminals 23, 24 have a higher density of heat dissipation fins 301 than a sixth zone 3f of the heat sink 3 disposed directly under the sixth terminal 26. Since the third and fourth terminals 23, 24 are integrally connected to the chip area 27 of the lead frame 20 connected to the light emitting diode package 1, the third and fourth zones 3c, 3d of the heat sink 3 disposed directly under the third and fourth terminals 23, 24 may have an increased density of heat dissipation fins 301 by decreasing the distance between the heat dissipation fins 301.

Referring to FIG. 6A and FIG. 6B, a fifth zone 3e of the heat sink 3 disposed directly under the fifth terminal 25 has a higher density of heat dissipation fins 301 than the sixth zone 3f of the heat sink 3 disposed directly under the sixth terminal 26. Since the sixth terminal 26 is a dummy terminal and may receive less heat than any other terminals during operation of the light emitting diode chip, the sixth zone 3f of the heat sink 3 disposed directly under the sixth terminal 26 has a low density of heat dissipation fins.

As described above, when the light emitting diode package 1 including a lead frame 20 having terminals with different widths is mounted on the printed circuit board 2 using a reflow soldering device, the reflow soldering device may be set to have different temperature zones therein. Thus, it is thus possible to prevent failure of the light emitting diode package 1 due to differences in thermal expansion and contraction. For example, the highest temperature zone may be placed at the middle of the device to minimize contraction rate.

According to an exemplary embodiment of the present invention, the light emitting diode package 1 has a structure wherein a specific terminal placed between two terminals disposed at one side of the light emitting diode package 1 has a greater width than a terminal placed between two other terminals disposed at the other side thereof. When the terminal placed at one side and having a greater width than the other terminal at the opposite side is used for electrical testing or used as a terminal for wire soldering, the reliability of a soldering process and/or electrical testing during manufacture of the light emitting diode package may be improved.

Further, a lead frame 20 of the light emitting diode package 1, according to an exemplary embodiment of the present invention, is bent within a package body 30 to connect a flat upper section 202 inside the package body 30 to a flat lower section 204 outside the package body 30 via a slanted connecting section 203 within the package body 30, so that the light emitting diode package 1 provides a number of moisture infiltration paths to the lead frame 20 in the package body 30, which thereby may reduce an interface failure due to water or moisture.

Further, the lead frame 20 according to an exemplary embodiment of the present invention is formed with the connection hole 202a which connects upper and lower portions of the package body 30 to each other, which may thereby improving durability and reliability of the light emitting diode package 1.

A heat sink 3 attached to a lower side of a printed circuit board 2 in an exemplary embodiment of the present invention has a plurality of regions having different densities of heat dissipation fins 301 arranged in consideration of heat dissipation characteristics of the light emitting diode package 1. The heat dissipation fins 301 may improve heat dissipation performance of the light emitting module including the light emitting diode package 1.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode package, comprising:
   a light emitting diode chip;
   a lead frame comprising a chip area on which the light emitting diode chip is arranged; and
   a package body supporting the lead frame,
   wherein the lead frame comprises a first terminal group arranged at a first side of the chip area and a second terminal group arranged at a second side of the chip area,
   wherein the first terminal group and the second terminal group each comprise a first terminal and a second terminal, and in at least one of the first terminal group and the second terminal group, the first terminal is connected to the chip area and the second terminal is separated from the chip area,
   wherein the first terminal comprises a first width, the second terminal comprises a second width, and the first width is different than the second width, and
   wherein the second terminal of the first terminal group comprises the second width, the second terminal of the second terminal group comprises a fourth width, and the second width is greater than the fourth width.

2. The light emitting diode package of claim 1, wherein in the first terminal group, the first width is smaller than the second width.

3. The light emitting diode package of claim 2, wherein in the second terminal group, the first terminal comprises a third width, and the third width is greater than the fourth width.

4. The light emitting diode package of claim 1, wherein the lead frame comprises an upper flat section within the package body, a lower flat section exposed outside of the package body, and a connecting section within the package body, the connection section connecting the upper flat section to the lower flat section.

5. The light emitting diode package of claim 4, wherein the package body comprises an upper portion arranged on a first side of the lead frame and a lower portion arranged on a second side of the lead frame, and
   wherein the lead frame comprises at least one connection hole through which the upper portion and the lower portion are connected to each other.

6. The light emitting diode package of claim 5, wherein the at least one connection hole is formed in the upper flat section of the lead frame.

7. A light emitting diode package, comprising:
   a light emitting diode chip;
   a lead frame comprising a chip area on which the light emitting diode chip is arranged; and
   a package body supporting the lead frame,
   wherein the lead frame comprises a first terminal group arranged at a first side of the chip area and a second terminal group arranged at a second side of the chip area,
   wherein the first terminal group comprises a first terminal and a second terminal connected to the first side of the chip area, and a fifth terminal separated from the chip area and arranged between the first terminal and the second terminal,
   wherein the second terminal group comprises a third terminal and a fourth terminal connected to the second side of the chip area, and a sixth terminal separated from the chip area and arranged between the third terminal and the fourth terminal, wherein the fifth terminal comprises a first width, and the first terminal and second terminal comprise a second width, and the first width is greater than the second width, and wherein a first electrode of the light emitting diode chip electrically connected to the first, second, third, and fourth terminals comprises a first polarity, a second electrode of the light emitting diode chip electrically connected to the fifth terminal comprises a second polarity opposite to the first polarity, and the sixth terminal comprises a dummy terminal with no polarity.

8. The light emitting diode package of claim 7, wherein the sixth terminal comprises a third width, and the first width is greater than the third width.

9. The light emitting diode package of claim 7, wherein the third terminal and the fourth terminal comprise a fourth width, and the second width is smaller than the fourth width.

10. The light emitting diode package of claim 7, wherein the first, second, and fifth terminals extend outside of the package body through a first side surface, and the third, fourth, and sixth terminals extend outside of the package body through a second side surface, wherein the first side surface is opposite to the second side surface.

11. The light emitting diode package of claim 10, wherein outside of the package body, a first distance between an outer surface of the first terminal and an outer surface of the second terminal is equal to a second distance between an outer surface of the third terminal and an outer surface of the fourth terminal, and a third distance between an inner surface of the first terminal and an inner surface of the second terminal is greater than a fourth distance between an inner surface of the third terminal and an inner surface of the fourth terminal.

12. The light emitting diode package of claim 7, wherein the lead frame further comprises a cut-out section formed on the chip area.

13. A light emitting module, comprising:
a printed circuit board;
a heat sink coupled to the printed circuit board; and
a light emitting diode package arranged on the printed circuit board, the light emitting diode package comprising:
a light emitting diode chip;
a lead frame having a chip area on which the light emitting diode chip is arranged; and
a package body supporting the lead frame,
wherein the lead frame comprises a first terminal group arranged at a first side of the chip area and a second terminal group arranged at a second side of the chip area,
wherein the printed circuit board comprises a plurality of lands to which the terminals are bonded, each land comprising a width corresponding to the width of the terminal bonded thereto,
wherein the first terminal group comprises a first terminal and a second terminal connected to the first side of the chip area, and a fifth terminal separated from the chip area and arranged between the first terminal and the second terminal,
wherein the second terminal group comprises a third terminal and a fourth terminal connected to the second side of the chip area, and a sixth terminal separated from the chip area and arranged between the third terminal and the fourth terminal,
wherein the fifth terminal comprises a first width, and the first terminal and second terminal comprise a second width, and the first width is greater than the second width, and
wherein first zones of the heat sink disposed directly under the first, second, third, and fourth terminals comprise a higher number of heat dissipation fins than that of a second zone of the heat sink disposed directly under the fifth terminal or a third zone of the heat sink disposed directly under the sixth terminal.

14. The light emitting module of claim 13, wherein the first terminal group and the second terminal group each comprise a first terminal and a second terminal, and in at least one of the first terminal group and the second terminal group, the first terminal is connected to the chip area and the second terminal is separated from the chip area, and
wherein the first terminal comprises a first width, the second terminal comprises a second width, and the first width is different than the second width.

15. The light emitting module of claim 13, further comprising:
a heat sink coupled to the printed circuit board, the heat sink comprising a plurality of zones comprising different numbers of heat dissipation fins.

16. The light emitting module of claim 13, wherein the second zone disposed directly under the fifth terminal comprises a higher number of heat dissipation fins than that of the third zone disposed directly under the sixth terminal.

* * * * *